(12) United States Patent
Yao et al.

(10) Patent No.: US 7,065,845 B2
(45) Date of Patent: Jun. 27, 2006

(54) METHOD FOR PREVENTING OPERATIONAL AND MANUFACTURING IMPERFECTIONS IN PIEZOELECTRIC MICRO-ACTUATORS

(75) Inventors: Minggao Yao, Dongguan (CN); Masashi Shiraishi, Kowloon (JP)

(73) Assignee: SAE Magnetics (H.K.) Ltd., Shatin (HK)

( * ) Notice: Subject to any disclaimer, the term of this patent is extended or adjusted under 35 U.S.C. 154(b) by 0 days.

(21) Appl. No.: 10/282,999

(22) Filed: Oct. 28, 2002

(65) Prior Publication Data

US 2003/0227235 A1  Dec. 11, 2003

(30) Foreign Application Priority Data

Jun. 5, 2002 (WO) .................... PCT/CN02/00392

(51) Int. Cl.
*H04R 17/00* (2006.01)
*H01L 41/04* (2006.01)
(52) U.S. Cl. .................... 29/25.35; 29/831; 310/340; 360/292; 360/294.4; 360/294.3
(58) Field of Classification Search .............. 29/25.35, 29/830, 846, 831; 310/311, 324, 340, 363, 310/365; 360/292, 294.4, 294, 294.3
See application file for complete search history.

(56) References Cited

U.S. PATENT DOCUMENTS

| | | | | |
|---|---|---|---|---|
| 2,657,320 A | * | 10/1953 | Ziegler | .................... 310/365 X |
| 4,056,654 A | * | 11/1977 | Kompanek | ............. 29/25.35 X |
| 4,583,135 A | * | 4/1986 | Kimura | ................ 360/294.4 X |
| 4,891,723 A | | 1/1990 | Zak | ............................. 360/106 |
| 5,305,168 A | | 4/1994 | Lin et al. | ..................... 360/104 |
| 5,875,531 A | * | 3/1999 | Nellissen et al. | .......... 29/25.35 |
| 6,108,175 A | * | 8/2000 | Hawwa et al. | ........... 360/294.4 |
| 6,198,606 B1 | | 3/2001 | Boutaghou et al. | ....... 360/294.3 |
| 6,262,516 B1 | | 7/2001 | Fukuda et al. | .............. 310/328 |
| 6,617,762 B1 | | 9/2003 | Kurano et al. | .............. 310/328 |
| 6,690,551 B1 | | 2/2004 | Shiraishi et al. | ......... 260/294.4 |

FOREIGN PATENT DOCUMENTS

| | | | | |
|---|---|---|---|---|
| JP | 64-11382 | * | 1/1989 | |
| JP | 3-203384 | * | 9/1991 | ................ 29/25.35 |

OTHER PUBLICATIONS

Wang et al., "Deflection Characteristics of a Trapezoidal Multilayer In-Plane Bending Piezoelectric Actuator", IEEE Transactions on Ultrasonics, Ferroelectrics and Frequency Control, vol. 48, No. 4, Jul. 2001, pp. 1103-1110.*
PCT Search Report PCT/CN02/00392 dated Jun. 5, 2002.

* cited by examiner

*Primary Examiner*—A. Dexter Tugbang
(74) *Attorney, Agent, or Firm*—Kenyon & Kenyon LLP (57) ABSTRACT

A method for preventing operational and manufacturing imperfections in piezoelectric micro-actuators by physically and electrically isolating conductive layers of the piezoelectric material. At least one layer of electrically-conductive material and at least one layer of electrically-insulative material are applied to an actuator finger. The conductive material and the insulative material are applied one layer upon another in an alternating manner. The layer of insulative material is larger in area than the layer of conductive material. An insulative layer, applied to the actuator finger and sandwiching a conductive layer between the insulative layer and the actuator finger, at least partially encloses and electrically isolates the conductive layer by covering the conductive material on at least three sides.

9 Claims, 9 Drawing Sheets

METHOD FOR PREVENTING OPERATIONAL AND MANUFACTURING IMPERFECTIONS IN PIEZOELECTRIC MICRO-ACTUATORS

BACKGROUND OF INFORMATION

The present invention relates to magnetic hard disk drives. More specifically, the present invention relates to a system and method for preventing piezoelectric micro-actuator manufacturing and operational imperfections.

Figure 1:
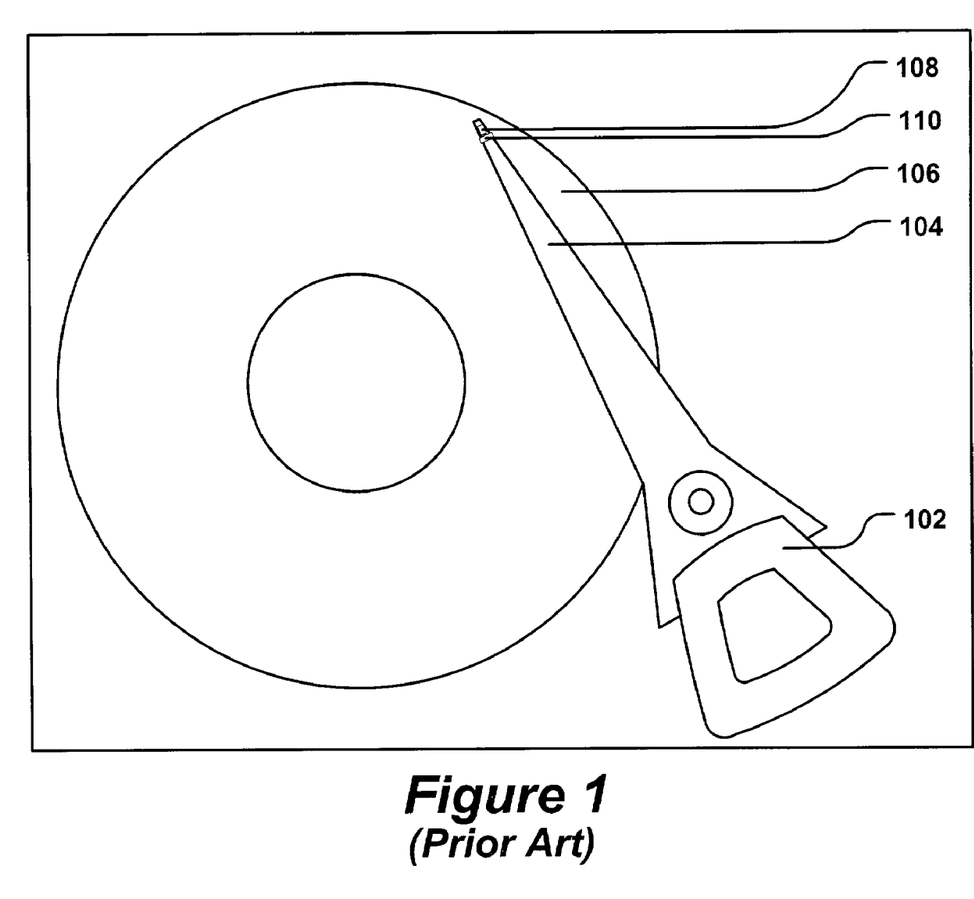
FIG. 1 provides an illustration of a drive arm configured to read from and write to a magnetic hard disk as used in the art.

In the art today, different methods are utilized to improve recording density of hard disk drives. FIG. 1 provides an illustration of a typical drive arm configured to read from and write to a magnetic hard disk. Typically, voice-coil motors (VCM) 102 are used for controlling a hard drive's arm 104 motion across a magnetic hard disk 106. Because of the inherent tolerance (dynamic play) that exists in the placement of a recording head 108 by a VCM 102 alone, micro-actuators 110 are now being utilized to 'fine-tune' head 108 placement, as is described in U.S. Pat. No. 6,198,606. A VCM 102 is utilized for course adjustment and the micro-actuator then corrects the placement on a much smaller scale to compensate for the VCM's 102 (with the arm 104) tolerance. This enables a smaller recordable track width, increasing the 'tracks per inch' (TPI) value of the hard drive (increased drive density).

Figure 2:
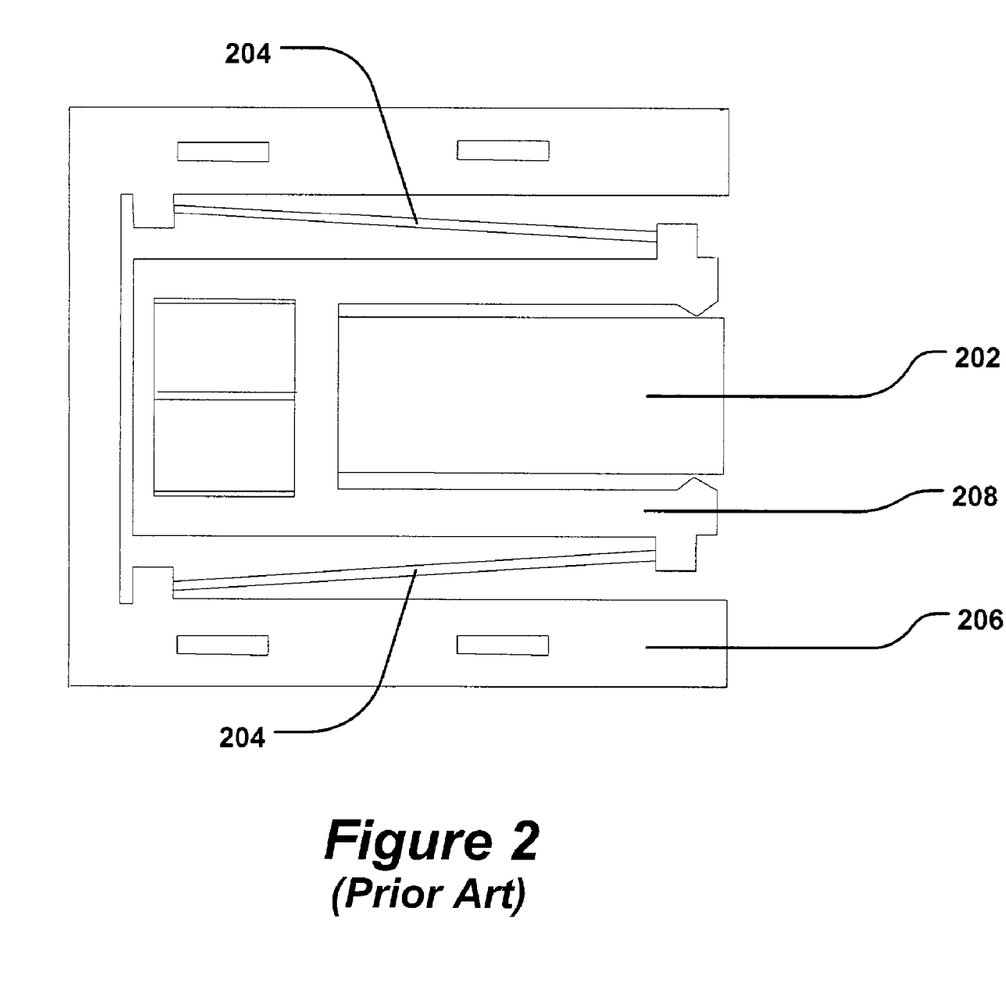
FIG. 2 provides an illustration of a micro-actuator as used in the art.

FIG. 2 provides an illustration of a micro-actuator as used in the art. Typically, a slider 202 (containing a read/write magnetic head; not shown) is utilized for maintaining a prescribed flying height above the disk surface 106 (See FIG. 1). Micro-actuators may have flexible beams 204 connecting a support device 206 to a slider containment unit 208 enabling slider 202 motion independent of the drive arm 104 (See FIG. 1). An electromagnetic assembly or an electromagnetic/ferromagnetic assembly (not shown) may be utilized to provide minute adjustments in orientation/location of the slider/head 202 with respect to the arm 104 (See FIG. 1).

Utilizing actuation means such as piezoelectrics (see FIG. 3), problems such as electrical sparking and particulate-enabled shortage can exist. It is therefore desirable to have a system for component treatment that prevents the above-mentioned problems in addition to having other benefits.

DETAILED DESCRIPTION

Figure 3:
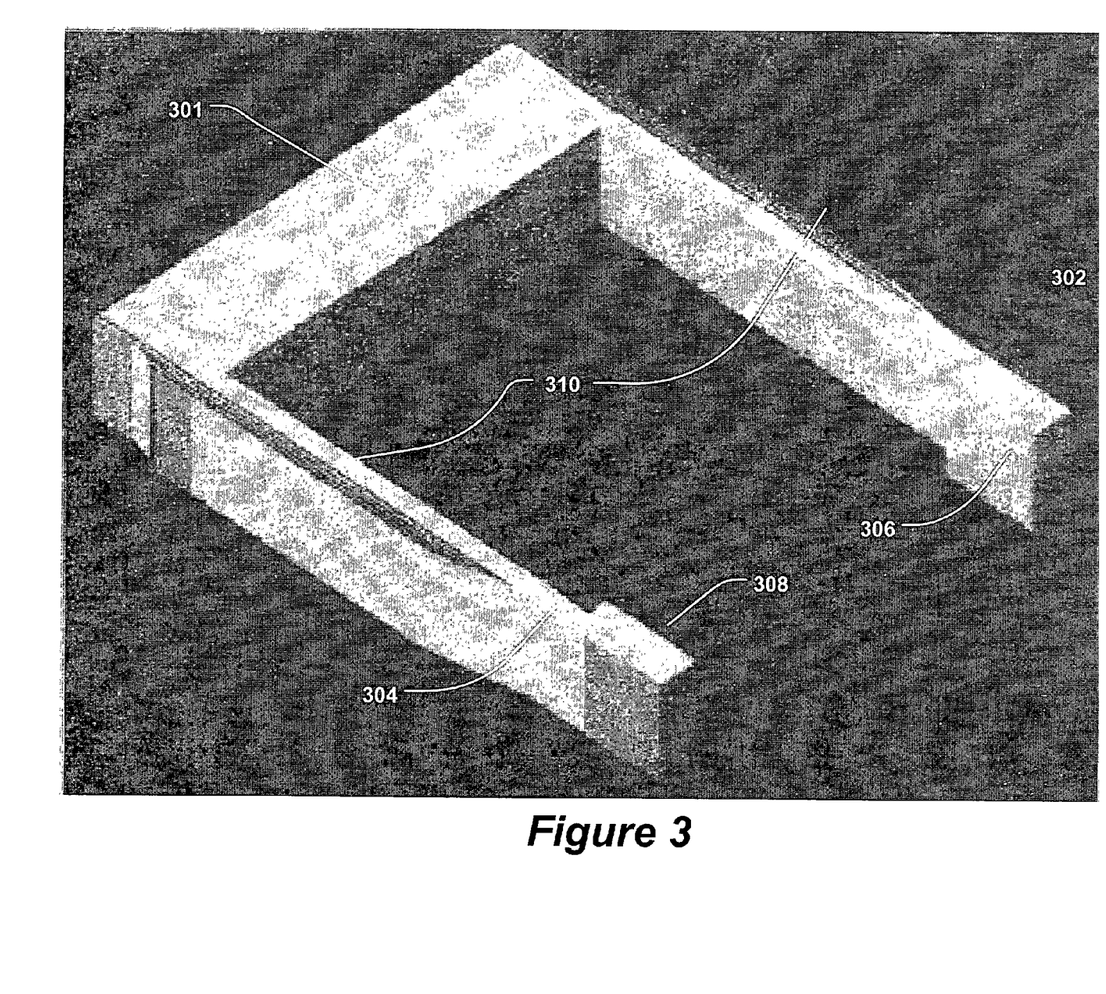
FIG. 3 provides an illustration of a 'U'-shaped micro-actuator utilizing multi-layered piezoelectric transducers (PZT) to provide slider actuation.

FIG. 3 provides an illustration of a 'U'-shaped micro-actuator utilizing multi-layered piezoelectric transducers (PZT) to provide slider actuation. A slider (not shown) is attached between two arms 302,304 of the micro-actuator 301 at two connection points 306,308. Layers 310 of PZT material, such as a piezoelectric ceramic material like lead zirconate titanate, are bonded to the outside of each arm (actuator finger) 302,304. PZT material has an anisotropic structure whereby the charge separation between the positive and negative ions provides for electric dipole behavior. When a potential is applied across a poled piezoelectric material, Weiss domains increase their alignment proportional to the voltage, resulting in structural deformation (i.e. regional expansion/contraction) of the PZT material. As the PZT structures 310 bend (in unison), the arms 302,304 (which are bonded to the PZT structures 310), bend also, causing the slider (not shown) to adjust its position in relation to the micro-actuator 301 (for magnetic head fine adjustments).

Figure 4:
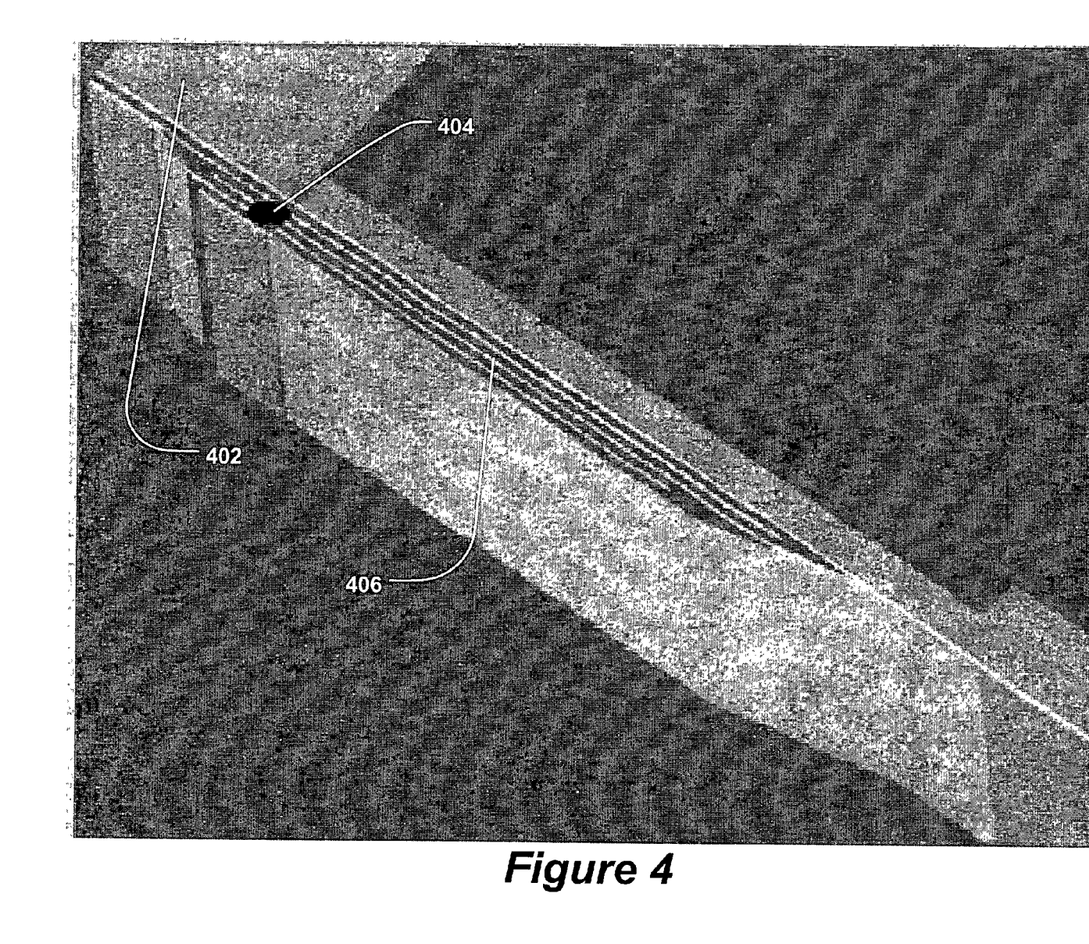
FIG. 4 illustrates a potential problem of particulate-enabled shorting between piezoelectric layers.

FIG. 4 demonstrates a potential problem of particulate-enabled shorting between piezoelectric layers. During manufacture and/or drive operation, particles may be deposited, and particle(s) 404 may end up bridging conductive layers 406. Relative humidity can cause the particle(s) to absorb moisture from the air, enabling electrical conduction between PZT layers. This short 404 in the piezoelectric structure 406 can prevent its normal operation, adversely affecting micro-actuator 402 performance.

Figure 5A:
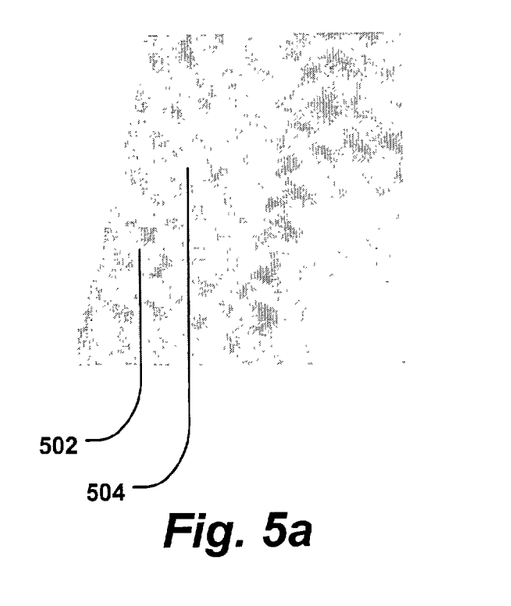
FIG. 5 illustrates various problems affecting PZT performance.
Figures 5B, 5C:
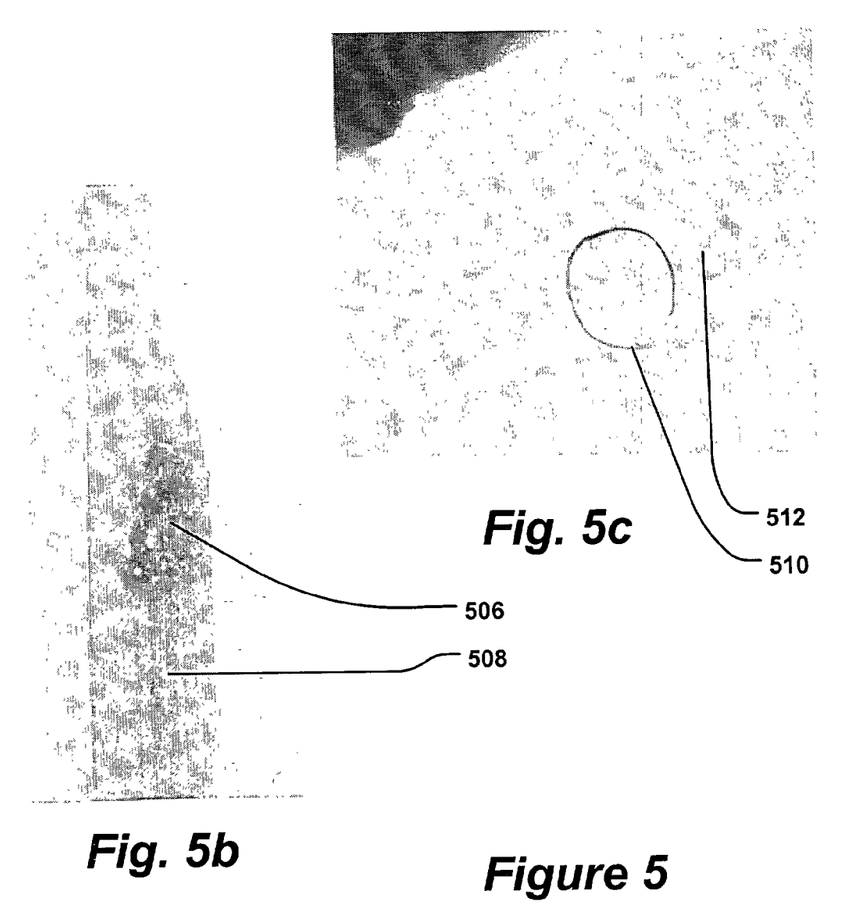

FIG. 5 illustrates various problems affecting PZT performance. FIG. 5a provides an image of a stray particle 504 bridging (and potentially shorting) piezoelectric layers 502. As stated above, humidity can cause the particle 504 to absorb moisture and become electrically conductive. FIG. 5b provides an image of damage caused by electrical arcing 506 between piezoelectric layers 508. Under the right conditions of voltage and air humidity, electricity may arc between piezoelectric layers 508, causing damage and deformation 506. FIG. 5c provides an image of 'smearing' 510 (and potentially shorting) between layers 512. Smearing can occur during manufacture when the micro-actuators are cut for separation. (See FIGS. 6 and 7). Material of the different layers 512 is smeared across one another as the cutting tool passes over the surface exposed by cutting.

Figure 6A:
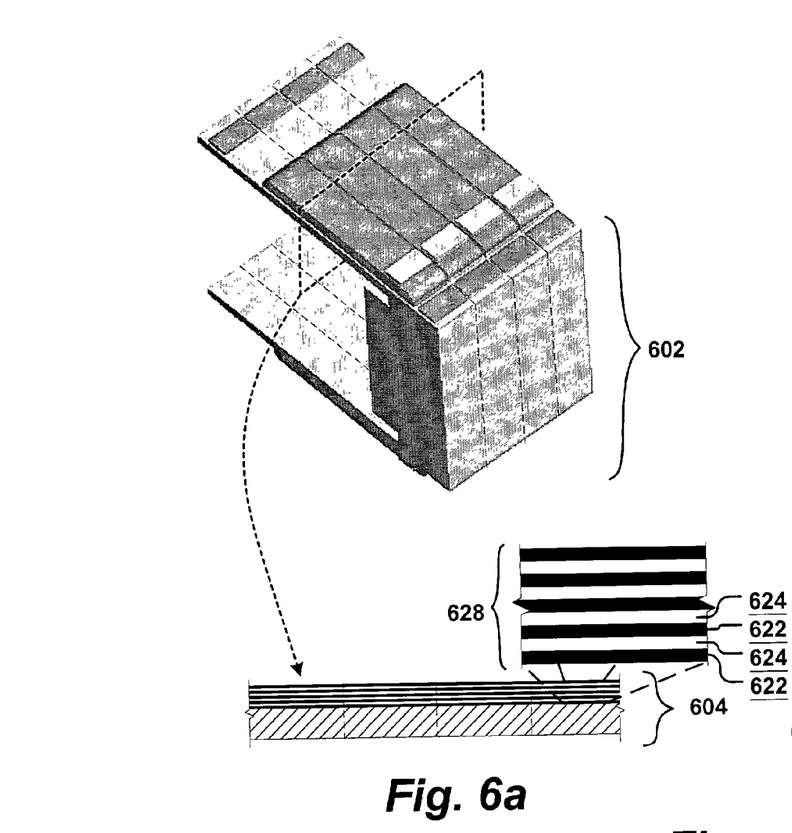
FIG. 6 provides a cross-section of the micro-actuator arms with the micro-actuators unseparated and a cross-section of a micro-actuator arm after micro-actuator separation.
Figure 6B:
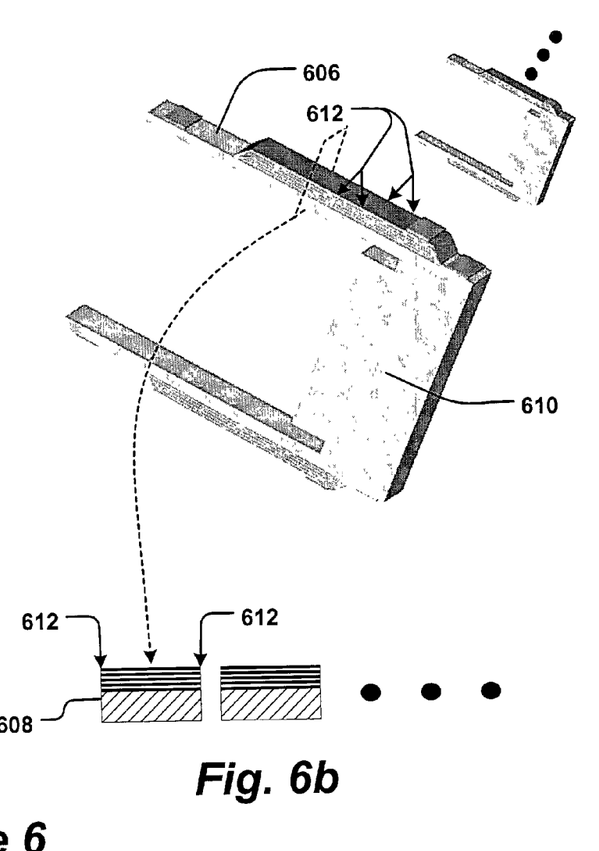

FIG. 6 provides a cross-section of the micro-actuator arms with the micro-actuators unseparated and a cross-section of a micro-actuator arm after micro-actuator separation. FIG. 6a illustrates a cross-section 604 of a portion 602 of a micro-actuator block structure. The cross-section 604 illustrates alternating layers 628 of conductive material 622 and PZT (insulating) material 624 applied to the micro-actuator. FIG. 6b illustrates a cross-section 608 of a micro-actuator arm 606 after separating the micro-actuator 610 from others. Separation 602 may be performed in one embodiment by mechanical means (e.g., a rotating wheel blade or a straight edge knife). Other embodiments involve electrical means for micro-actuator separation (e.g., electric sputtering or ion milling). Further, chemical means may be used (e.g., chemical vapor deposition (CVD)). Note that the sides 612 of the micro-actuator arm (finger) 606 expose the piezoelectric layers, including the electrically-conductive layers 622.

Figure 7A:
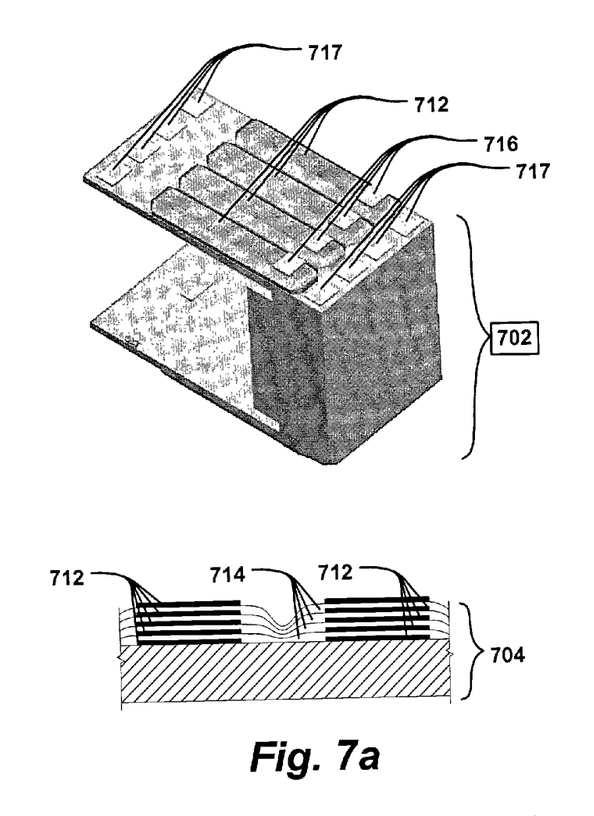
FIG. 7 provides a cross-section of the micro-actuator arms with the micro-actuators unseparated and a cross-section of a micro-actuator arm after micro-actuator separation under principles of the present invention.
Figure 7B:
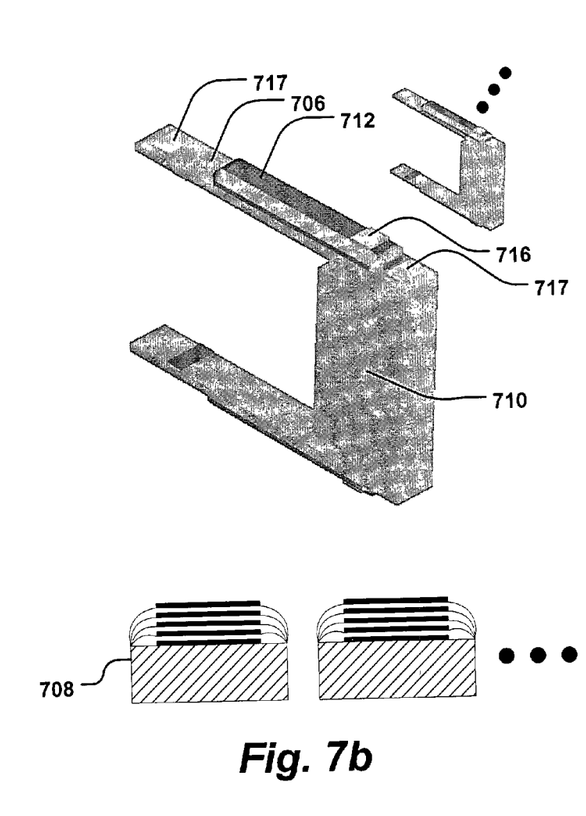

FIG. 7 provides a cross-section of the micro-actuator arms with the microactuators unseparated and a cross-section of a micro-actuator arm after micro-actuator separation and ending with conductive layer application under principles of the present invention. FIG. 7a illustrates a cross-section 704 of a portion 702 of a micro-actuator block structure. FIG. 7b illustrates a cross-section 708 of a micro-actuator arm 706 after separating the micro-actuator 710 from others. In one embodiment of the present invention, after a set of conductive strips (conductive material) 712, such as gold, platinum or copper, are placed upon the micro-actuator arm 706, a PZT layer (insulative layer) 714 is applied over and between the conductive strips 712, physically and electrically isolating the conductive strips 712. Another set of conductive strips 712 and a PZT layer 714 are applied and the process is repeated until the number of layers and/or thickness is appropriate for the micro-actuator's application and performance. In one embodiment, the last layer applied is the conductive strip 712, followed by the placement of a bonding pad 716 upon the piezoelectric layers (and on opposite ends 717 of the micro-actuator finger 706, see also FIG. 9). In one embodiment, four to six layers PZT layers are utilized (five to seven conductive layers).

In one embodiment, upon separation of the micro-actuators 710, the PZT layers 714 physically isolate the conductive strips 712 from each other, and thus, prevent 'smearing' (and potential shorting). Further, the PZT layers 714 electrically insulate the sides of the piezoelectric layers, preventing 'arcing' damage and particulate contamination (electrical bridging/shorting).

Figure 8A:
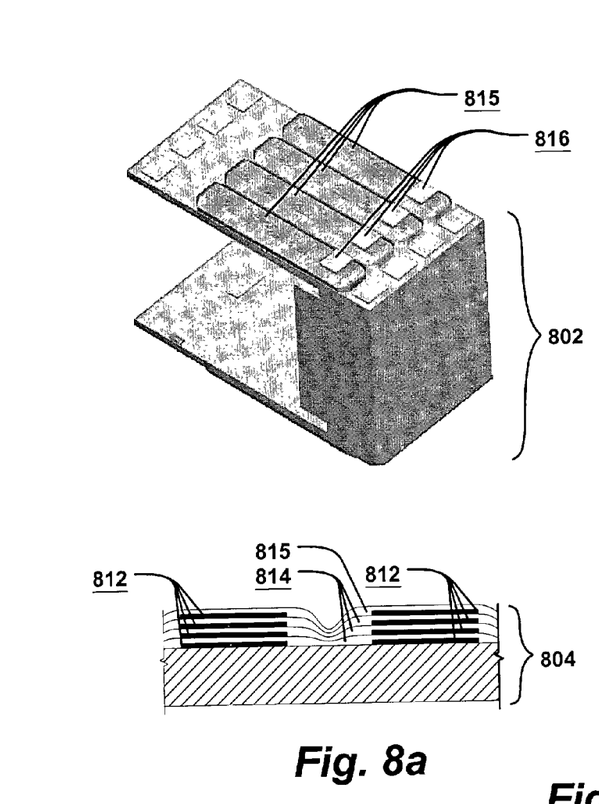
FIGS. 8a–b provides a cross-section of the micro-actuator arms with the micro-actuators unseparated and a cross-section of a micro-actuator arm after micro-actuator separation and ending with PZT layer application under principles of the present invention.
Figure 8B:
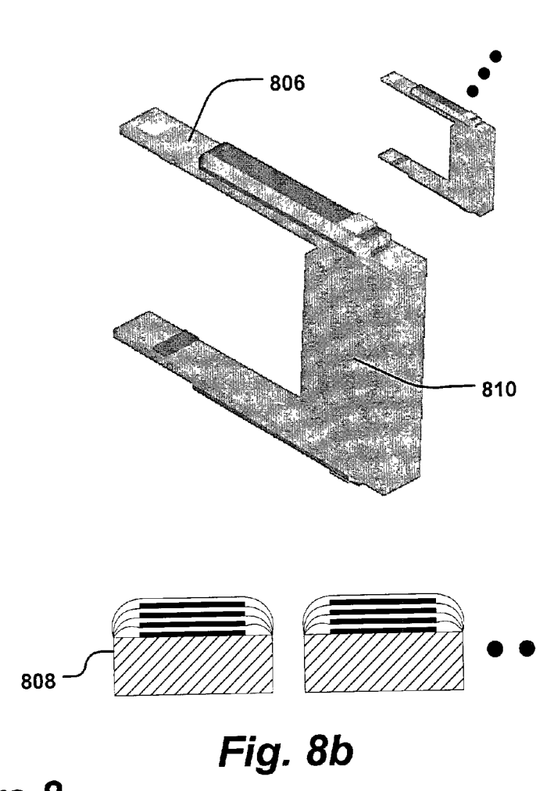

FIG. 8 provides a cross-section of the micro-actuator arms with the micro-actuators unseparated and a cross-section of a micro-actuator arm after micro-actuator separation and ending with PZT layer application under principles of the present invention. FIG. 8a illustrates a cross-section 804 of a portion 802 of a micro-actuator block structure. FIG. 8b illustrates a cross-section 808 of a micro-actuator arm 806 after separating the micro-actuator 810 from others. In one embodiment of the present invention, after a set of conductive strips (conductive material) 812, such as gold, platinum or copper, are placed upon the micro-actuator arm 806, a PZT layer (insulative layer) 814 is applied over and between the conductive strips 812, physically and electrically isolating the conductive strips 812. Another set of conductive strips 812 and a PZT layer 814 are applied and the process is repeated until the number of layers and/or thickness is appropriate for the micro-actuator's application and performance. In one embodiment, the last layer applied is a PZT layer 815. In one embodiment, the last PZT layer 815 provides a 'window' (gap in insulation) for the bonding pad 816 to be attached within. (See FIG. 8). In one embodiment, four to six PZT layers and four to six conductive layers are utilized.

In one embodiment, upon separation of the micro-actuators 810, the PZT layers 814,815 physically isolate the conductive strips 812 from each other, and thus, prevent 'smearing' (and potential shorting). Further, the PZT layers 814,815 electrically insulate the sides of the piezoelectric layers, preventing 'arcing' damage and particulate contamination (electrical bridging/shorting).

Figure 9:
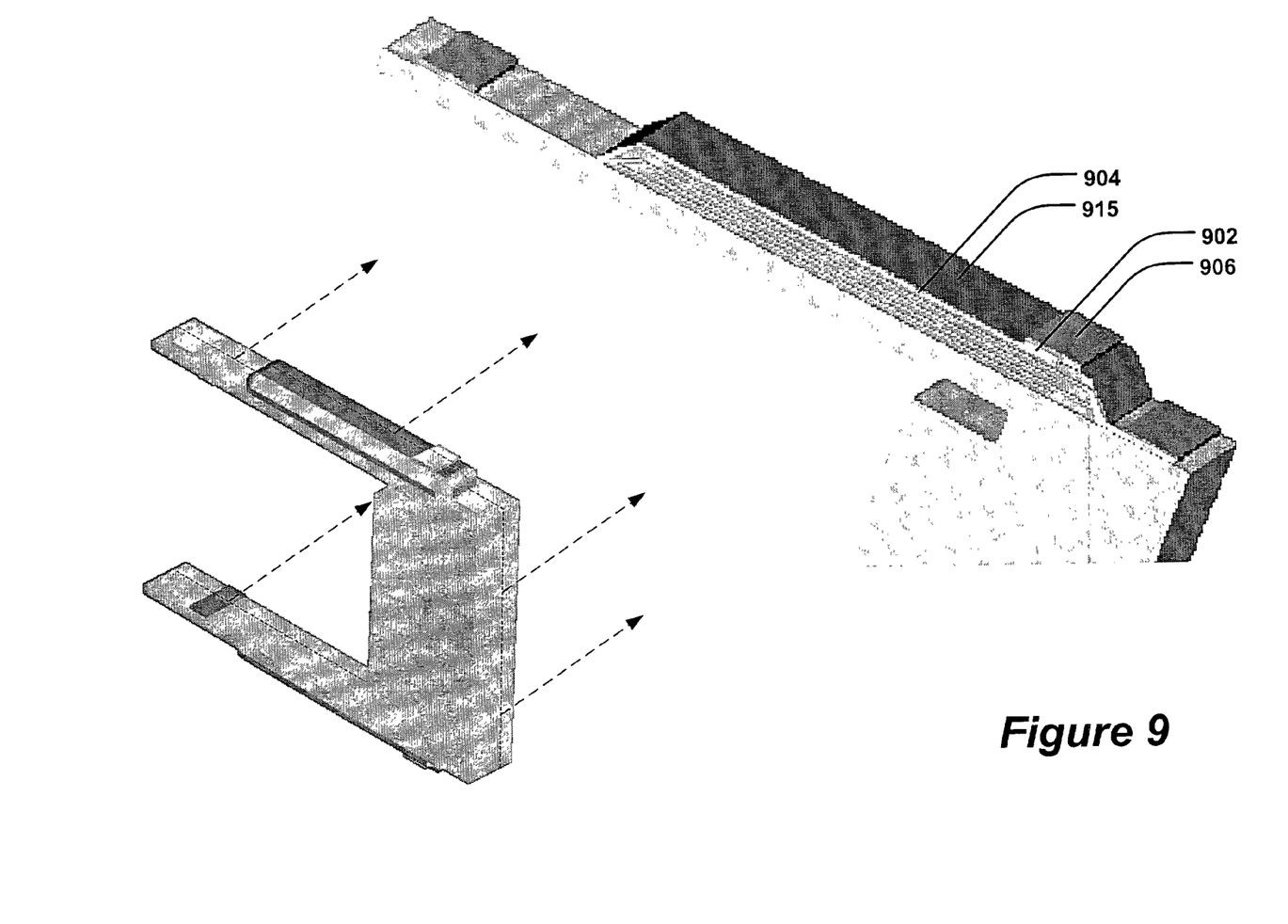
FIG. 9 provides a cross-section of a finger of a micro-actuator under principles of the present invention.

FIG. 9 provides a cross-section of a finger of a micro-actuator under principles of the present invention. In an embodiment, a window 902 is provided in the last PZT layer of 915 to give a conduction path between the top conductive layer (strip) 904 and the bonding pad 906.

Although several embodiments are specifically illustrated and described herein, it will be appreciated that modifications and variations of the present invention are covered by the above teachings and within the purview of the appended claims without departing from the spirit and intended scope of the invention.

The invention claimed is:

1. A method of manufacturing an actuator comprising:
applying at least one layer of electrically-conductive material and at least one layer of electrically-insulative material to an actuator finger, wherein
said conductive material and said insulative material are applied one layer upon another in an alternating manner; and
said layer of insulative material is larger in area than said layer of conductive material such that an insulative layer, applied to said actuator finger and sandwiching a conductive layer between said insulative layer and said actuator finger, at least partially encloses and electrically isolates said conductive layer by covering said conductive material on -both latitudinal sides of said conductive material.

2. The method of claim 1, wherein said conductive material and said insulative material are applied one layer upon another in an alternating manner, the conductive material being the last layer applied.

3. The method of claim 1, wherein said conductive material and said insulative material are applied one layer upon another in an alternating manner, the insulative material being the last layer applied.

4. The method of claim 3, wherein a window is provided in the last insulative layer for placement of a bonding pad.

5. The method of claim 1, wherein said conductive material is a metal.

6. The method of claim 5, wherein said conductive material is from the group consisting of Gold, Platinum, and Copper.

7. The method of claim 1, wherein said insulative material is a piezoelectric ceramic material.

8. The method of claim 7, wherein said insulative material is lead zirconate titanate.

9. The method of claim 1, wherein said actuator finger is a hard disk drive micro-actuator finger.

* * * * *